(12) United States Patent
Helt et al.

(10) Patent No.: US 6,522,185 B2
(45) Date of Patent: Feb. 18, 2003

(54) VARIABLE DELAY CMOS CIRCUIT WITH PVT CONTROL

(75) Inventors: Christopher George Helt, Ft. Collins, CO (US); Guy Harlan Humphrey, Ft. Collins, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/796,306

(22) Filed: Feb. 28, 2001

(65) Prior Publication Data

US 2002/0118056 A1 Aug. 29, 2002

(51) Int. Cl.[7] .............................................. H03H 11/26
(52) U.S. Cl. ...................................... 327/276; 327/158
(58) Field of Search ................................ 327/153, 158, 327/161, 392, 393, 276, 277, 278, 284, 285, 281

(56) References Cited

U.S. PATENT DOCUMENTS

| | | | | |
|---|---|---|---|---|
| 5,039,893 A | * | 8/1991 | Tomisawa | 327/276 |
| 5,192,886 A | * | 3/1993 | Wetlaufer | 326/126 |
| 5,220,216 A | | 6/1993 | Woo | 307/469 |
| 5,420,531 A | * | 5/1995 | Wetlaufer | 327/270 |
| 5,581,197 A | * | 12/1996 | Motley et al. | 326/30 |
| 5,712,583 A | * | 1/1998 | Frankeny | 327/158 |
| 5,731,727 A | * | 3/1998 | Iwamoto et al. | 327/158 |
| 5,886,946 A | | 3/1999 | Ooishi | 365/233 |
| 5,936,986 A | * | 8/1999 | Cantatore et al. | 372/31 |
| 5,998,983 A | * | 12/1999 | Gerber | 327/538 |
| 6,118,310 A | | 9/2000 | Esch, Jr. | 327/108 |
| 6,175,605 B1 | * | 1/2001 | Chi | 327/161 |
| 6,178,123 B1 | * | 1/2001 | Kato et al. | 327/158 |
| 6,262,609 B1 | * | 7/2001 | Hafez et al. | 327/101 |

FOREIGN PATENT DOCUMENTS

EP  0868026 A1  9/1998  ............ H03K/5/13

* cited by examiner

*Primary Examiner*—Timothy P. Callahan
*Assistant Examiner*—Linh Nguyen

(57) ABSTRACT

An electronic circuit and method for processing a signal, including a variable-delay transmission gate for receiving a binary input signal and propagating a delayed binary output signal corresponding to the input signal. The propagation delay in the transmission gate is controlled by two complimentary, non-binary, control signals from a current mirror that is driven by a PVT-compensated voltage follower.

23 Claims, 7 Drawing Sheets

VARIABLE DELAY CMOS CIRCUIT WITH PVT CONTROL

TECHNICAL FIELD

The present disclosure is generally related to electronic digital logic circuitry affecting signal sensitivity or transmission integrity and, more particularly, to a method and apparatus for variably controlling the propagation delay of a binary signal.

BACKGROUND

"CMOS" is an acronym for the Complementary Metal Oxide Semiconductor. As the name implies, CMOS devices are formed using metal conductors, oxide insulators, and "semiconductors." Semiconductors are crystalline materials having electrical properties between that of a conductor and an insulator. The conductivity of semiconductor material can be precisely controlled in a process called "doping" where a small amount of "dopant" is added to an otherwise pure, or "intrinsic," semiconductor material. Doping leaves behind mobile, charged carriers for conducting electricity in the otherwise electrically-neutral semiconductor crystal lattice. When intrinsic semiconductor materials are doped so as to add negative charge carriers to the lattice, the material is referred to as an "n-type," or donor "extrinsic" semiconductor, while the addition of positive carriers creates a "p-type," acceptor material.

A "transistor" is one particular type of semiconductor device that is noteworthy for its ability to operate as an electrical switch or amplifier, depending upon its configuration. There are two basic types of transistors—bipolar (or junction) transistors and field-effect transistors ("FETs"). Although equivalent digital circuits can be created using either transistor technology, FET technology is often preferred and will be used for the various examples described here.

The term "field-effect" is related to the application of an "electromotive field," or voltage, to a "gate" terminal connected near the "junction" of the p-type and n-type materials. This gate voltage controls the size of a conductive "channel" through which electrons must flow through as they pass from the "source" terminal to the "drain" terminal, or vice versa. Consequently, the gate voltage can be used to control the source-drain current through the channel in an FET.

Metal-oxide FETs, or "MOSFETs," have an additional layer of a non-conductive oxide material (such as silicon dioxide) that insulates the gate terminal from the channel. Consequently, the gate current is very small regardless of the applied voltage so that circuits using MOSFETs can be made to consume, or "dissipate," very little power. MOSFETs are characterized by their mode of operation and whether the channel is made from an n- or p-type semiconductor material. "Depletion-mode" operation occurs when the gate-source voltage (between the gate and source terminals) is used to deplete the channel of free carriers so as to reduce the size of the conductive channel and increase its resistance. In contrast, "enhancementmode" operation occurs when the gate voltage is chosen to increase the size of the channel and thus decrease the source-drain resistance. Enhancement-mode MOSFETs are generally preferred, however, because the device will be normally "off" (i.e., the source drain resistance will be high) when the gate voltage falls below a certain "threshold value."

Nonetheless, even when the gate voltage is low enough to turn "off" an enhancement-mode MOSFET, the resistance between the source and drain terminals is still generally not large enough to prevent current from flowing between the source and drain under a large source-drain voltage. Consequently, as shown in FIG. 1, a MOSFET 5 is typically arranged in a digital circuit 10 with a resistor Rd, where G, D, S refer to the gate, source, and drain terminals. In addition, the source terminal is usually grounded in order to provide a reference voltage (of zero volts) with regard to the applied voltage at the drain Vdd.

In FIG. 1, the broken line inside the MOSFET 5 indicates that the transistor operates in enhancement mode and is therefore normally off (when Vin is zero). It will also be noted the source and substrate terminals are internally connected in the MOSFET symbol that is used in FIG. 1. However, depletion-mode and/or enhancement-mode MOSFETs with external and/or no connections between the source and substrate terminals may also be used. The direction of the arrow indicates whether the source and drain are connected by an n-type inversion layer as shown in FIG. 1, or a p-type inversion layer where the arrow is reversed. The MOSFET 5 is also equivalently represented with the circular "envelope" removed.

In the circuit configuration shown in FIG. 1, the resistor Rd will act as a voltage divider when the transistor is conducting (and current is flowing between the source and drain) so as to prevent the transistor from receiving large currents. Consequently, when an input voltage Vin (that is larger than the threshold value) is applied to the gate terminal G, current will flow through Rd to create a corresponding low output voltage Vout near the gate terminal. Similarly, when input voltage Vin is removed, Vout will return to nearly the value of Vdd. For gate voltages that are between the threshold voltage and ground, the device will partially conduct, and thus act essentially as a variable resistor.

The direction of the source drain current will depend upon the polarity of the applied voltages as is well known in the art. However, since the output voltage Vout is opposite to the input voltage Vin, this simple digital circuit is called an "inverter." Of course, "on" and "off" are relative terms that depend on the configuration of the applied voltages. Therefore, switching from any state to the another state is often more-generally referred to as "actuating" from an "asserted" state to a "deasserted" state.

The resistor Rd in FIG. 1 is referred to as a "passive load" because its power-consumption effect on the circuit does not change. FIG. 2 illustrates another inverter configuration 20 where the passive resistor Rd is replaced with another n-type enhancement MOSFET 5 that actuates, and thus provides full resistance, when Vdd is high. This second digital circuit configuration for an inverter shown in FIG. 2 is generally preferred because it is smaller and easier to fabricate than the one shown in FIG. 1.

FIG. 3 illustrates yet another embodiment of a conventional MOSFET inverter 30 including an (upper) p-type enhancement MOSFET 7 and a (lower) n-type enhancement MOSFET 5. The p-type enhancement-mode MOSFET 7 is "complementary" to the n-type MOSFET 5 device in that all voltages and currents are reversed from the n-type device 5. Consequently, replacing one of the n-MOSFETS in the inverter 20 in FIG. 2 with a p-MOSFET creates a Complementary Metal-Oxide Semiconductor, or "CMOS," inverter 30 where when one device is on, the other is off, and vice-versa. The basic CMOS inverter can be modified to build other complementary circuits as described below.

For example, the inputs and outputs of two of the CMOS inverters 30 shown in FIG. 3 can be connected in series to create the uni-directional "driver" 40 shown in FIG. 4. The driver 40 is also referred to as a "uni-directional CMOS transmission gate," or "buffer." Since there are two inverters in series, Vout in this device will follow Vin. However, due to the inherent "capacitance," or ability to store energy in the form of opposite charges (e.g., that are segregated in the different layers of material) in each of the transistors, each inverter 30 will require a small period of time before it fully changes the state of its charge. Thus, the inputs and outputs for several inverters 30 can be "cascaded" to create a delay between the time that Vout changes in response to Vin. Furthermore, increasing Vdd relative to ground will reduce this "signal propagation delay," and vice versa. However, increasing Vdd also increases energy dissipation and reliability concerns due to increased oxide breakdowns, hot-electrons, and other effects that should be avoided. Signal propagation delay in cascaded CMOS inverters is further discussed in Rabey, "Digital Integrated Circuits, A Design Perspective," chapter 5, galley sheets from http://bwrc.eecs.berkeley.edu/Classes/IcBook/NewChapters/ (Prentice Hall, 2d edition 2001) which is incorporated by reference here.

A signal propagation delay can also be created using a transmission gate, such as the bi-directional full CMOS transmission gate, or "CMOS switch," 50 shown in FIG. 5. However, unlike the cascaded inverters 40 shown in FIG. 4, the bi-directional switch 50 will propagate a delayed voltage signal from Vin to Vout, and in the opposite direction, from Vout to Vin. CMOS digital circuits, transmission gates, and propagation delays are also discussed in more detail in Demassa et al., "Digital Integrated Circuits," pp. 336–476 (John Wiley & Sons 1996) and which is also incorporated herein by reference.

Smith et al., "Circuits Devices and Systems," pp. 212–215 (John Wiley & Sons 1976) generally describes how maximum power transfer occurs in an electrical circuit when the "impedance" of the load matches the equivalent impedance of the power source, and is also incorporated by reference here. In simple terms, impedance can be thought of as the effective resistance of a circuit due to its ability to dissipate (through resistance) and store energy (through capacitance and/or inductance) at the same time. Impedance matching can then be analogized to an electrical power source having an inherent capacitance (or inductance) that starts to discharge its stored energy at the same time that a "parasitic" capacitance (or inductance) in the connected electrical device, or "load," starts to recharge. If both of the capacitors (or inductors) have the same electrical properties, i.e. matched impedance, then they will transfer the same amount of "energy" between each other, at roughly the same time, so as to minimize losses during these transfers of "reactive power."

In a similar manner, it can be shown that the propagation delay of signal from a voltage source that is connected to a digital circuit is minimized when the capacitance of the driver is matched to the inherent capacitance of the digital circuit to which it is connected. This phenomenon can be analogized to the inherent load capacitance (in the digital circuit) being able to charge and/or discharge (change state) more quickly when the inherent source capacitance (in the driver) discharges/charges with the same amount of energy at the same time. This propagation delay actually becomes longer as the voltage changes become more frequent and is, therefore, even more pronounced for faster digital circuits. Thus, proper impedance matching is very important, not only for providing adequate power, but also for ensuring that data signals propagate through digital circuits without unnecessary delay.

U.S. Pat. No. 5,581,197 to Motley et al., also incorporated by reference here, describes various undesirable side effects that follow from failing to match the output impedance of a driver to the characteristic impedance of a transmission line to which it is connected. It also states that variations in integrated circuit manufacturing processes and ambient operating temperature can combine to produce changes in the output driver stage impedance that must be compensated for. These, and other, variables affecting the operation of semiconductor devices are sometimes referred to as process (or photo), voltaic, temperature effects, or "PVT" effects. This patent goes on to disclose an apparatus having a programmable current source that determines a composite source impedance for the CMOS output driver stages that matches the load capacitance of a transmission line. However, Motley et al do not consider binary data signals or the problems associated with the propagation delay of those signals.

The power source for the Motley et al. device includes an operational amplifier, or "op amp." An op amp is basically a "differential amplifier" that responds to a voltage difference between its positive and negative input terminals by producing a larger voltage at its output terminal that is in proportion to the differential input voltage. Op amps are generally characterized by their high "gain," or ability to produce a large output voltage for a relatively small input differential voltage. Op amps are also characterized by their high input impedance and low output impedance. Consequently, they can be arranged in amplification circuits, such as the circuit 60 shown in FIG. 6, that draw little input current but can produce as much output current as is necessary in order to maintain an output voltage.

As shown in FIG. 6, the output voltage Vout of the amplification circuit 60 is equal to the inverse of the input voltage Vin multiplied by the resistance ratio Rvar/Rin. Thus the voltage gain between the input and output of the amplifier circuit 60 can be controlled by varying the resistance Rvar. Furthermore, since the gain of the amplifier circuit, Vout/Vin, is independent of (but less than) the gain "A" of the amplifier itself, the gain of the amplifier circuit is generally unaffected by temperature, input frequency, or device parameters associated with the electronic devices that form the op amp.

If Rvar is chosen to be equal to Rin in the amplification circuit of FIG. 6 the resulting amplification circuit has a gain of −1 so that Vout will equal −Vin. Such amplification circuits are referred to as unity gain buffers, or "voltage followers" since any change in voltage at the output caused by a change in load will cause the op amp to work harder (or less hard) in order to bring the output voltage back up (or down) to match the input voltage. In addition, since the input resistance of the op amp is typically very large relative to the load resistance, the op amp can provide substantial current while drawing nearly zero current from its power source. This isolation, or "buffering," of the load current from the source current produces a very stable output voltage regardless of changes in the load impedance. Op amps and amplifier circuits are also discussed in more detail in Smith, "Circuits, Devices, and Systems," chapter 19 (John Wiley & Sons 1976) which is also incorporated by reference here.

Motley et al. also disclose that PVT compensation can be provided for by voltage follower circuits using the configuration shown in FIG. 7 where Rvar has been replaced with an n-type enhancement MOSFET 5 having its gate terminal connected to the amplifier output, its drain connected to ground, and its source connected to the non-inverting (+) amplifier input. Also, the inverting input to the op amp A is provided with a non-zero reference voltage. In this configuration, the MOSFET 5 acts essentially as a variable resister in order to slightly amplify, or attenuate, the voltage follower output Vout in response to PVT effects in the circuit being powered. More specifically, a higher Vout produces a lower resistance through MOSFET 5 so as to lower the feedback voltage, Vfb.

In addition, Motley et al. disclose the "gate voltage mirror" 80 shown in FIG. 8. In essence, the gate voltage mirror 80 includes p-type MOSFET 7 and n-type MOSFET 5 connected in series so that they each have the same source-drain current. In addition, the gate of the p-type MOSFET is connected to its drain. In this configuration, as Vin on the n-type MOSFET gate (or "Vngate") goes higher, Vout on the p-type MOSFET gate (or "Vpgate") will go lower, so as to create a smaller voltage difference between Vngate and Vpgate, and vice versa.

The subject matter of U. S. Pat. Nos. 5,220,216 and 6,118,310, and European Pat. Application No. 868,026 A1 is also incorporated by reference here. U.S. Pat. No. 5,220,216 to Woo discloses CMOS gate having a programmable driving power characteristic for digitally varying its propagation delay. U.S. Pat. No. 6,118,310 to Esch discloses a digitally controlled output driver and method for impedance matching. EP 868 026 A1 to Watarai et al. discloses a variable delay CMOS circuit for reducing process dependence.

SUMMARY OF THE DISCLOSURE

The present disclosure generally relates to an electronic circuit for processing a signal, and a signal processing method, including variable-delay propagation of a binary signal. For example, the circuit may include a transmission gate that receives a binary input signal and propagates a delayed binary output signal corresponding to the input signal.

The propagation delay is controlled by at least one control signal provided to the transmission gate. For example, the control signal may be provided by a voltage mirror in response to a non-binary input signal. The non-binary input signal may be set by a variable resistor and the device may include a voltage follower for maintaining the setting of the non-binary input signal. Furthermore, the voltage follower may include a gate-controlled feedback loop that compensates for PVT effects.

The variable-delay transmission gate preferably includes at least two inverters arranged in cascade, and a gate stacked on each side of the inverters. Each of the two stacked gates then controls a current through at least one of the inverters in response to complimentary control signals provided by the voltage mirror. For example, each of the attached gates may include at least one, but preferably two, field-effect transistors such as a complementary n- and p-type enhancement-mode MOSFETs.

Other features and advantages of the disclosed embodiments will also be apparent to one with skill in the art upon examination of the following drawings and detailed description. It is intended that all of these other systems, methods, features, and advantages be included within the scope of this description.

BRIEF DESCRIPTION OF THE DRAWINGS

The various embodiments will now be described with respect to the following figures, where the reference numerals have been consistently used to identify the same features in each of the drawings.

DETAILED DESCRIPTION OF THE PREFERRED EMBODIMENTS

Various aspects of the present invention can be implemented in hardware, software, firmware, or a combination thereof. In the embodiment(s) discussed below, the circuit is implemented in hardware that may include any combination of the several technologies, which are all well known in the art, including discrete logic circuits having logic gates for implementing logic functions upon data signals, application specific integrated circuits (ASIC) having appropriate combinational logic gates, programmable gate arrays (PGA), field programmable gate arrays (FPGA), and etc.

Figure 1:
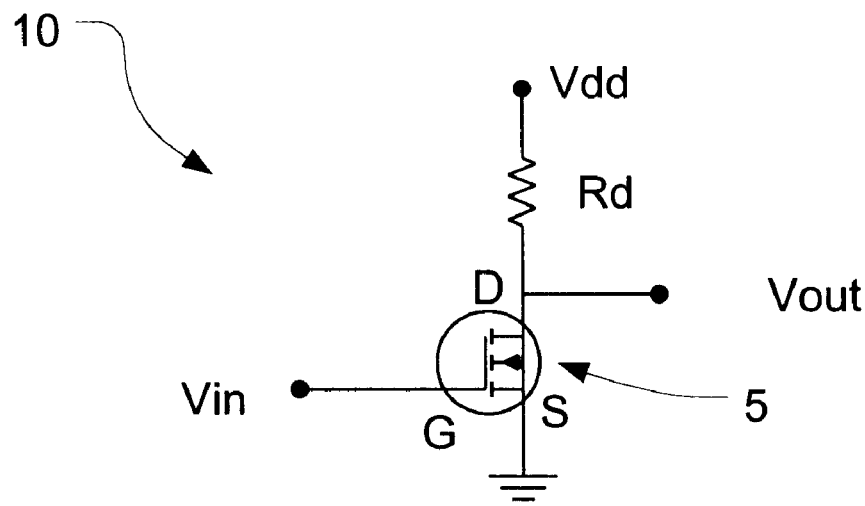
FIG. 1 is a circuit diagram for a conventional n-type enhancement-mode MOSFET device.
Figure 2:
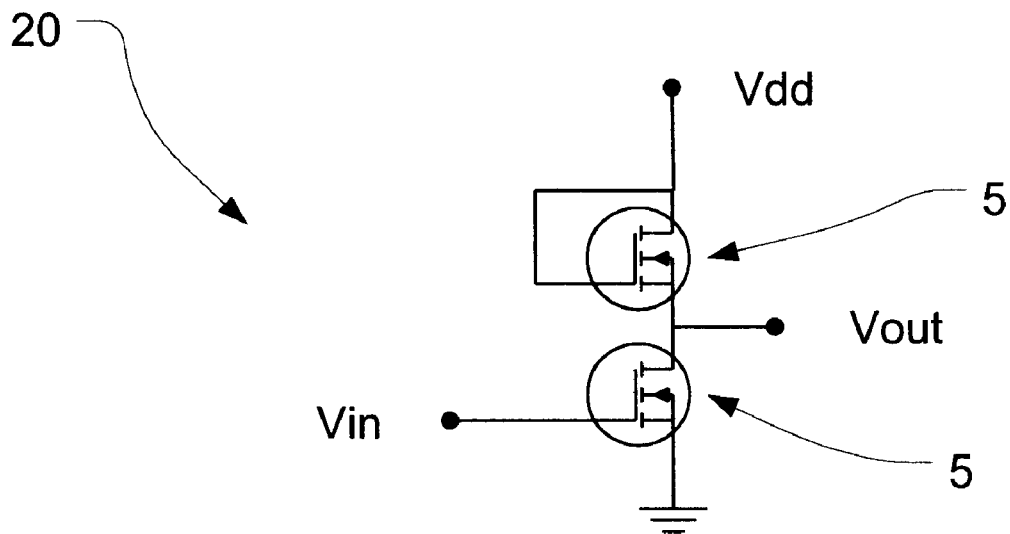
FIG. 2 is a circuit diagram for a conventional MOSFET inverter.
Figure 3:
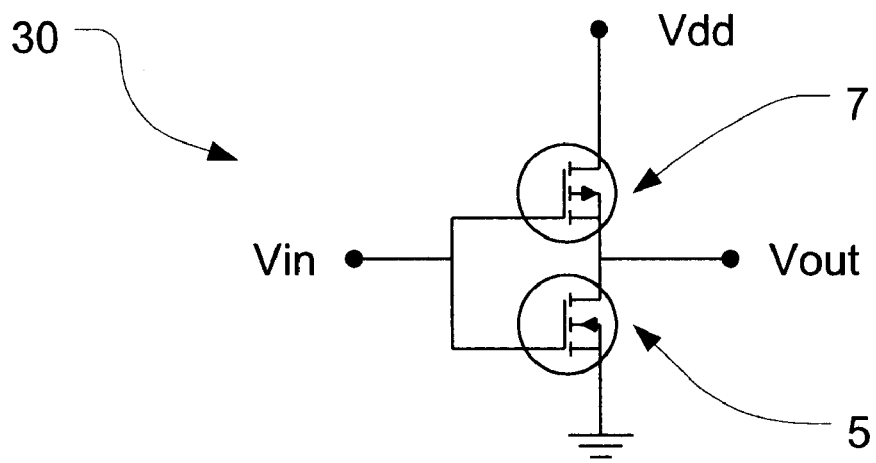
FIG. 3 is a circuit diagram for a conventional CMOS inverter.
Figure 4:
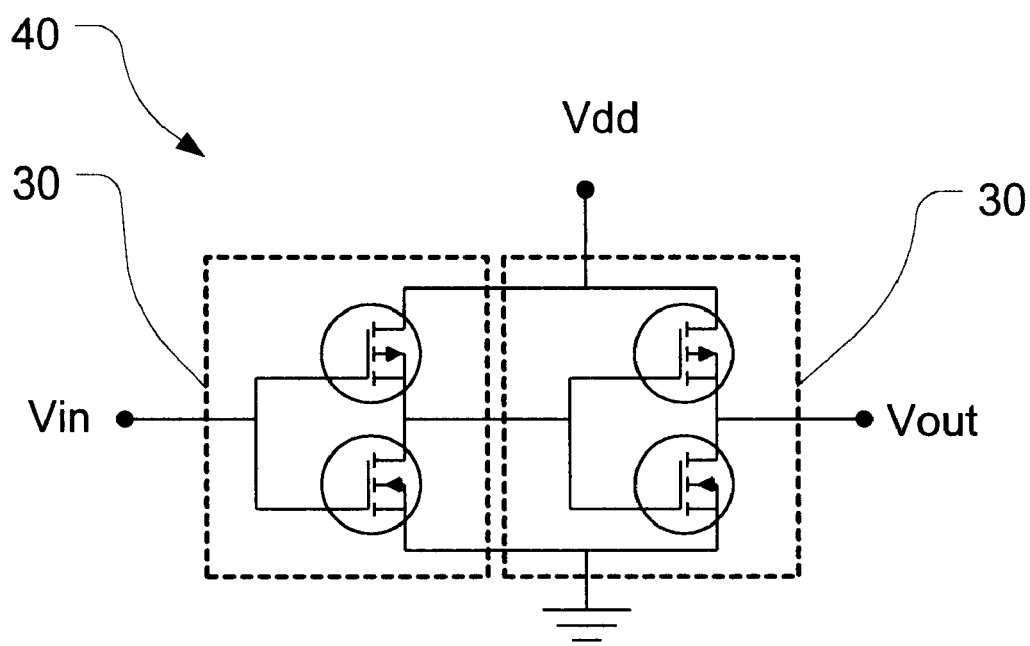
FIG. 4 is a circuit diagram for a conventional uni-directional CMOS transmission gate.
Figure 5:
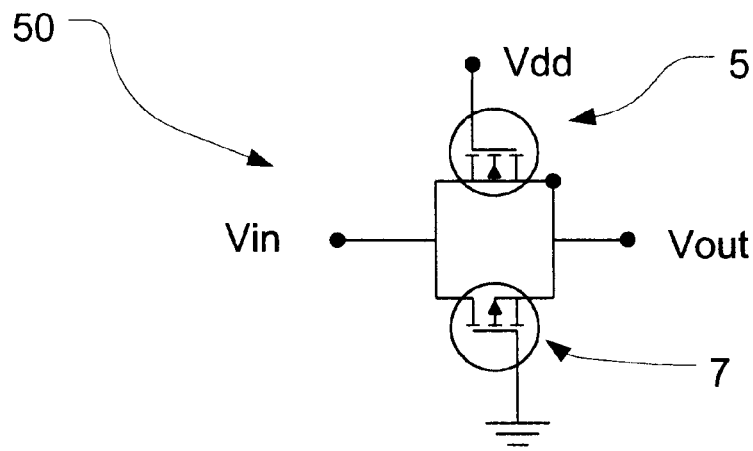
FIG. 5 is a circuit diagram for a conventional, bi-directional CMOS transmission gate.
Figure 6:
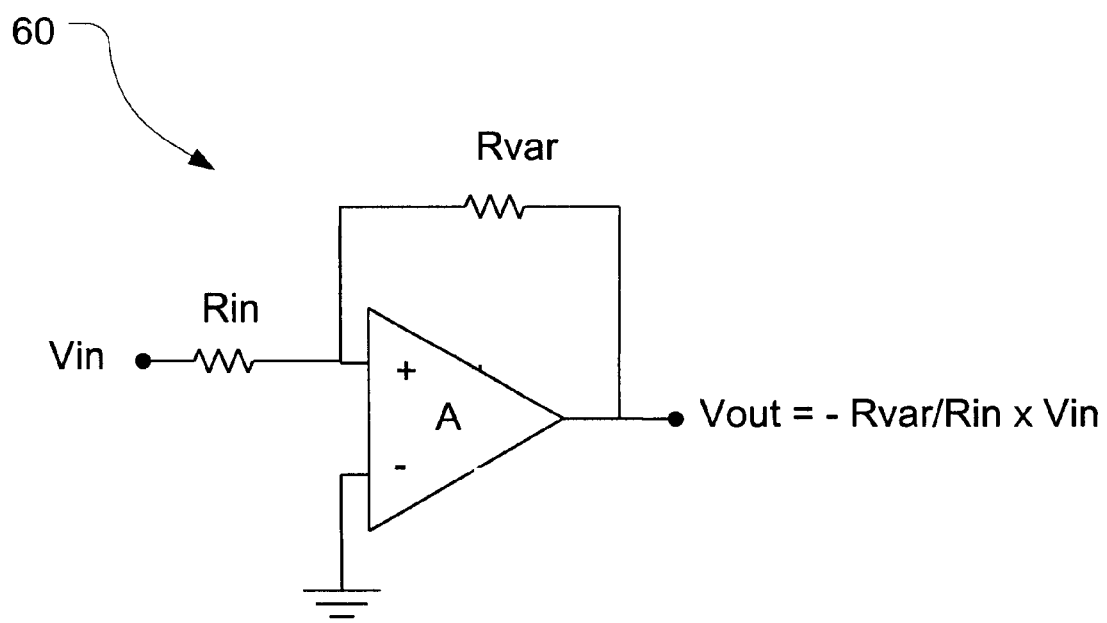
FIG. 6 is a circuit diagram for a conventional amplification circuit including an op-amp.
Figure 7:
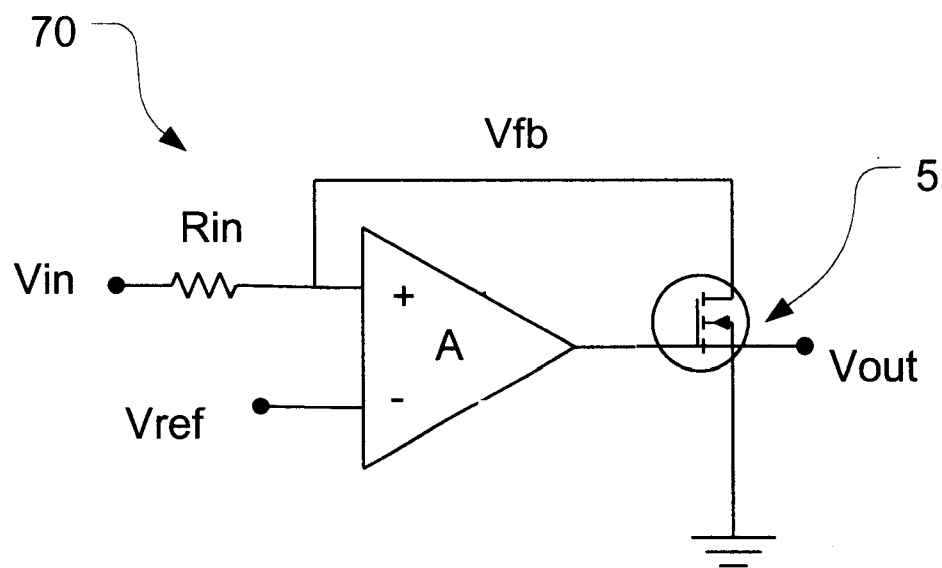
FIG. 7 is a circuit diagram for a conventional voltage follower including a transistor-controlled feedback loop.
Figure 8:
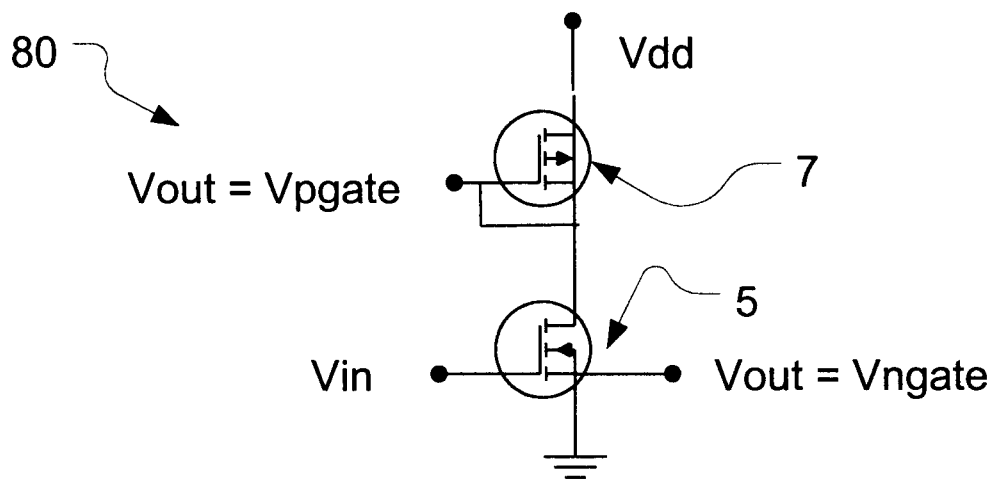
FIG. 8 is a circuit diagram for a conventional voltage mirror.
Figure 9:
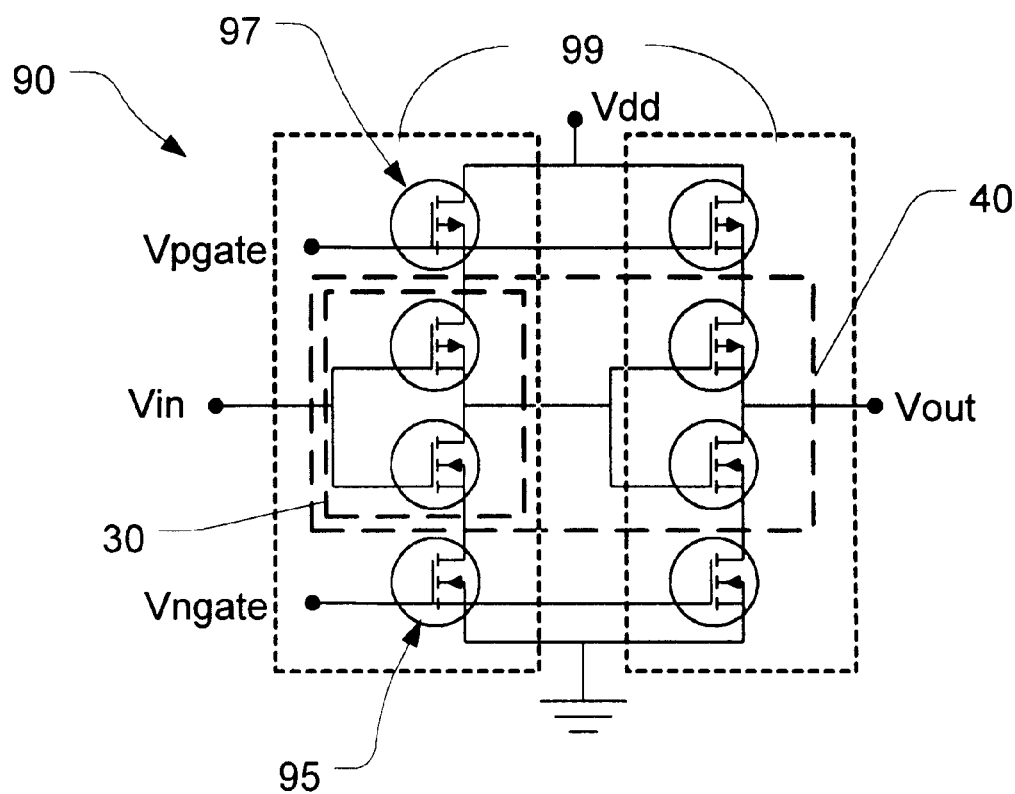
FIG. 9 is a circuit diagram for a variable-delay CMOS transmission gate.

FIG. 9 is a circuit diagram for a variable-delay transmission gate 90, and in particular, a variable-delay CMOS transmission gate. The variable-delay transmission gate 90 receives a binary input signal and propagates a delayed output signal corresponding to the input signal. The variable-delay transmission gate 90 includes a uni-directional CMOS transmission gate 40 having two CMOS inverters 30 arranged in cascade. In addition, gates 95 and 97 are stacked on each side of each inverter 30 for controlling the source-drain current through the inverters in response to control signals Vpgate and Vngate, respectively. Gates 95 and 97 are preferably p-type and n-type enhancement-mode MOSFETs, respectively. However, a variety of other transistor technologies may be used, including bipolar transistors.

In this configuration, gates 95 and 97 are configured as inverter control gates 99. Although FIG. 9 illustrates a uni-directional CMOS transmission gate 40 with two inverters 30 arranged in series (each with its own inverter control gate 99), a single inverter control gate 99, or just one gate 95, 97 may be provided for controlling the source-drain current through any, or all, of the inverters 30. Other current controlling devices may also be used, such as variable and fixed resistors. Similarly, additional inverters 30 may be added to the uni-directional CMOS transmission gate 40. Also, additional control gates 99 may be added to the variable-delay transmission gate 90.

Figure 10:
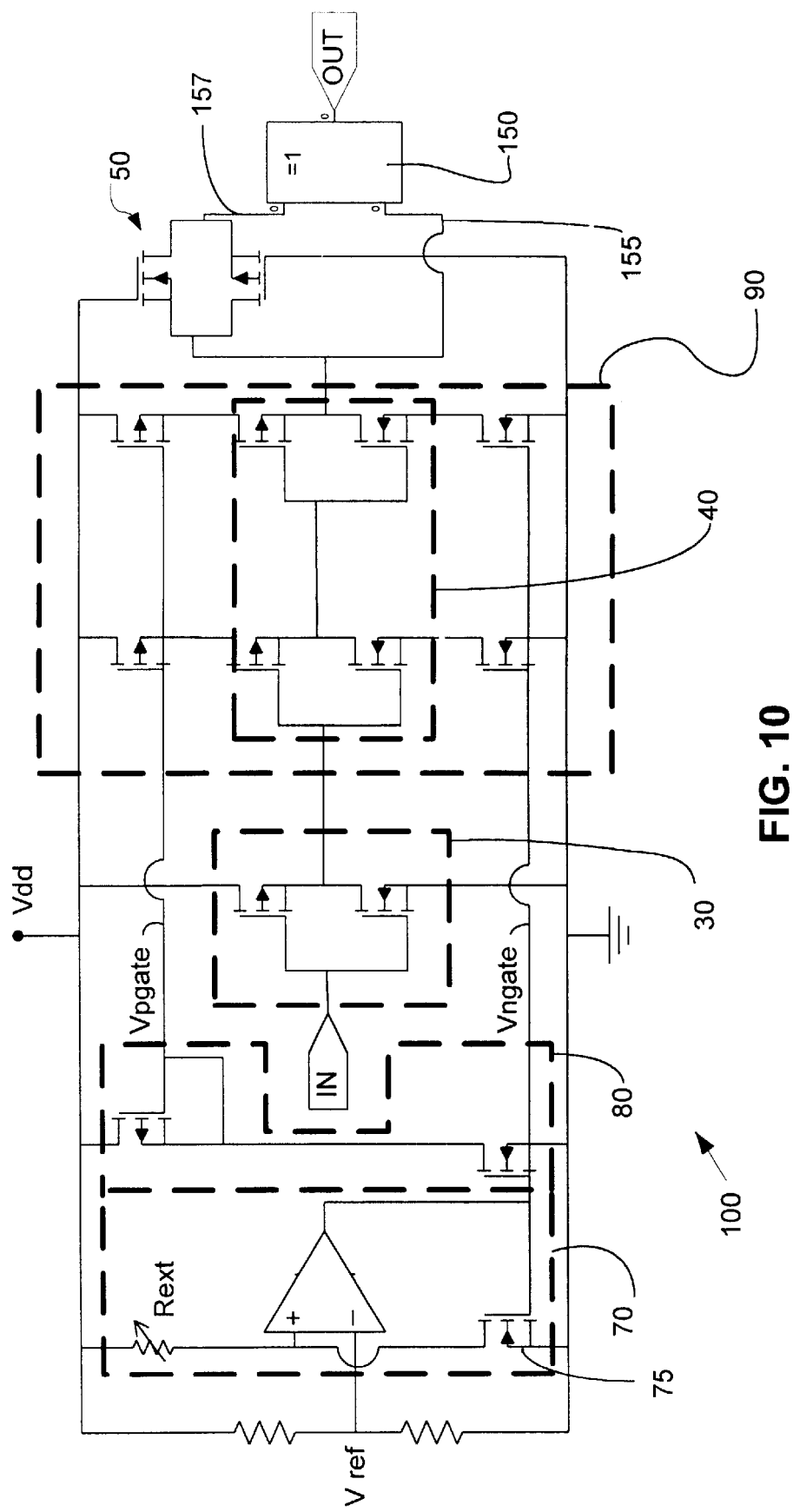
FIG. 10 is a circuit diagram for a variable-delay CMOS circuit with PVT control.

FIG. 10 is a circuit diagram for a variable-delay CMOS circuit 100 with PVT control. As illustrated in FIG. 10, the variable-delay CMOS transmission gate 90 is preferably controlled by complementary control signals, Vpgate and Vngate, which are preferably provided by a voltage mirror 80 for controlling the propagation delay through the transmission gate 90. However, Vpgate and Vngate may also be provided by other complementary voltage sources besides voltage mirrors. The voltage mirror 80 is preferably driven by a voltage follower 70, or other voltage source, having its input voltage determined by the setting of the external variable resistor Rext. In addition, the voltage follower 70 is provided with a feedback loop that is controlled by gate 75 so as to compensate for PVT effects in the remainder of the variable-delay CMOS circuit 100. The external resistor Rext is preferably arranged remote from the remainder of the circuit 100 so as to allow for convenient, manual adjustment. However, Rext may be a local and/or non-variable resistor that is chosen for a certain propagation delay. Rext may also be supplemented and/or replaced by a voltage-controlled gate.

During operation, a binary input signal "IN" is applied to CMOS inverter 30 and output to variable-delay CMOS transmission gate 90. The propagation delay for the inverted signal is then controlled by the signals Vpgate and Vngate, which are set by the voltage mirror 80 in response to the output of the current follower 70. Thus, the propagation delay of the signal through the variable-delay CMOS transmission gate 90 can be controlled by varying the resistance of Rext without changing Vdd.

Furthermore, an additional fixed propagation delay can be added to the output from the variable-delay gate 90 by, for example, further processing the signal through the bidirectional CMOS transmission gate 50. Alternatively, a unidirectional CMOS transmission gate 40 or another variable-delay CMOS transmission gate 90 may be used. The delayed signal output from the variable-delay transmission gate 90 may then be compared to the further delayed output from the transmission gate 50 to create a clock pulse "OUT." For example, as illustrated in FIG. 10, an XOR logic gate 150 may be provided for producing the clock pulse "OUT" based upon the delayed signal in line 155 and the further delayed signal in line 157. The CMOS transmission gate 50 may also be located ahead of the variable-delay transmission gate 90.

Figure 11:
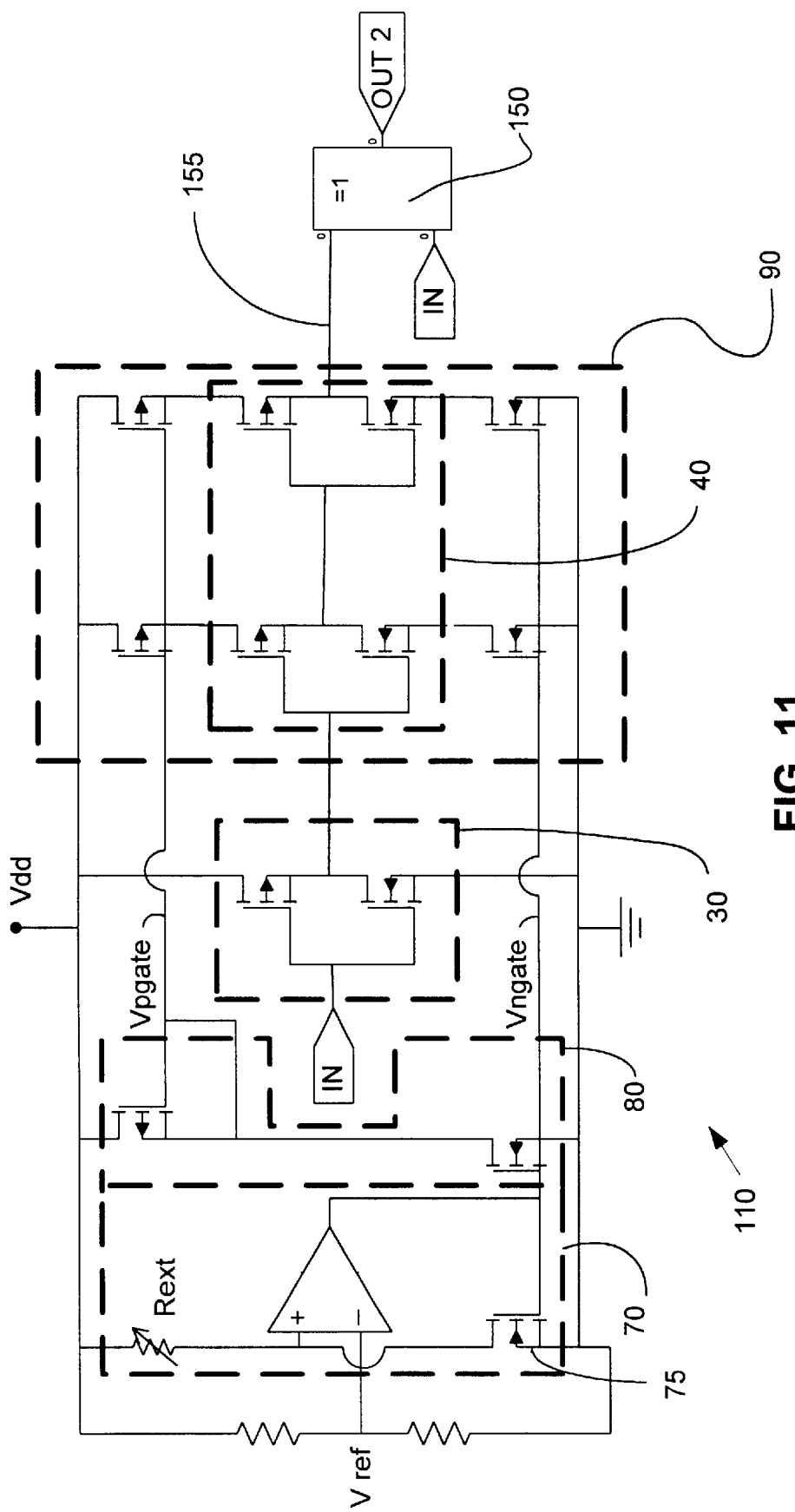
FIG. 11 is a circuit diagram for a variable pulse-width CMOS circuit with PVT control.

FIG. 11 is a circuit diagram for a variable pulse-width CMOS circuit 110 with PVT control. The variable pulse-width circuit 110 is substantially the same as the variable-delay circuit 100 in FIG. 10 except that the bi-directional transmission gate 50 has been removed and line 157 has been connected to the binary input signal IN. Output signal OUT2 will therefore have a different pulse-width than input signal IN, where the pulse-width is controlled by the resistance of the external resister Rext.

It should be emphasized that the embodiments described above, and in particular any "preferred embodiments," are merely examples of possible implementations, that are used here to set forth a general understanding of the structure, function, and other principles for making and using the inventions defined by the following claims. Consequently, many variations and modifications may be made to these embodiments without substantially departing from the scope of these claims.

What is claimed is:

1. An electronic circuit comprising:
   a variable resistor that provides a non-binary input signal having a controlled setting;
   a voltage follower receiving the non-binary input signal, the voltage follower including a gate-controlled feedback loop and providing an output configured to maintain the controlled setting of said non-binary input signal;
   a voltage mirror that provides two complementary control signals in response to said non-binary input signal, the control signals configured to control propagation delay; and
   a variable-delay transmission gate that receives a binary input data signal and the two complementary control signals, the variable-delay transmission gate configured to propagate a delayed output signal corresponding to the binary input data signal, the delayed output signal being delayed by a propagation delay controlled by the control signals of the voltage mirror.

2. The circuit recited in claim 1 further comprising a fixed-delay transmission gate for providing a further delayed binary signal in response to the delayed output signal from the variable-delay transmission gate.

3. The circuit recited in claim 2, further comprising an XOR logic gate for providing a clock signal in response to said delayed signal and said further delayed signal.

4. The circuit recited in claim 1 wherein said variable-delay transmission gate includes
   at least two inverters arranged in cascade;
   a gate stacked on each side of at least one of the inverters; and
   each of the stacked gates controlling a current through the at least one inverter in response to complementary control signals provided to each of the gates, respectively, by the voltage mirror.

5. The circuit recited in claim 1 wherein said transmission gate includes at least one field-effect transistor.

6. The circuit recited in claim 5 wherein said field-effect transistor is an enhancement-mode MOSFET.

7. The circuit recited in claim 2 wherein each of said gates includes at least one field-effect transistor.

8. The circuit recited in claim 7 wherein said field-effect transistor is an enhancement-mode MOSFET.

9. The circuit recited in claim 4 wherein each of said gates includes at least one field-effect transistor.

10. The circuit recited in claim 9 wherein said field-effect transistor is an enhancement-mode MOSFET.

11. An electronic circuit comprising:
    means for providing a non-binary input signal having a controlled setting;
    means for receiving the non-binary input signal, the means for receiving including a gate-controlled feedback loop;
    means for compensating for PVT effects;
    means for providing an output configured to maintain the controlled setting of the non-binary input signal;
    means for providing two complementary control signals in response to said non-binary input signal, the control signals configured to control propagation delay;
    means for receiving a binary input data signal and the two complementary control signals; and
    means for propagating a delayed output signal corresponding to the binary input data signal, the delayed output signal being delayed by a propagation delay controlled by the two complementary control signals.

12. The circuit recited in claim 11 wherein said first means includes a variable-delay CMOS transmission gate.

13. The circuit recited in claim 12, further comprising:
    a fixed-delay CMOS transmission gate for receiving the delayed output signal and generating a further delayed signal; and means for generating a clock pulse from the delayed signal and further delayed signal.

14. A method for processing signals, the method comprising the steps of:
providing a non-binary input signal having a controlled setting;
receiving the non-binary input signal, the means for receiving including a gate-controlled feedback loop;
compensating for PVT effects;
providing an output configured to maintain the controlled setting of the non-binary input signal;
providing two complementary control signals in response to said non-binary input signal, the control signals configured to control propagation delay;
receiving a binary input data signal and the two complementary control signals; and
propagating a delayed output signal corresponding to the binary input data signal, the delayed output signal being delayed by a propagation delay controlled by the two complementary control signals.

15. The circuit recited in claim 12, further comprising means for generating a variable clock pulse in response to the delayed signal and the binary input signal.

16. The circuit recited in claim 1, wherein said voltage follower further comprises means for compensating an output of the voltage follower for PVT effects.

17. The circuit recited in claim 16 wherein said compensating means includes a gate-controlled feedback loop.

18. The circuit recited in claim 16, further comprising a variable resistor for controlling an output from the voltage follower.

19. The circuit recited in claim 17, further comprising a variable resistor for controlling an output from the voltage follower.

20. The circuit recited in claim 1, wherein said variable resistor is an external variable resistor.

21. The circuit recited in claim 11 further comprising an external variable resistor for controlling an output from the voltage follower.

22. The circuit recited in claim 11 wherein said compensating means includes a gate-controlled feedback loop.

23. The circuit recited in claim 22, further comprising a variable resistor for controlling an output from the voltage follower.

* * * * *